United States Patent [19]

Savignac et al.

[11] Patent Number: 5,166,546
[45] Date of Patent: Nov. 24, 1992

[54] INTEGRATED CIRCUIT FOR GENERATING A RESET SIGNAL

[75] Inventors: Dominique Savignac, Ismaning; Dieter Gleis, Grosskarolinenfeld; Brian Murphy, Munich, all of Fed. Rep. of Germany

[73] Assignee: Siemens Aktiengesellschaft, Munich, Fed. Rep. of Germany

[21] Appl. No.: 823,860

[22] Filed: Jan. 22, 1992

[30] Foreign Application Priority Data

Jan. 23, 1991 [EP] European Pat. Off. ........ 91100851.4

[51] Int. Cl.[5] ........................ G11C 11/00; H03K 3/01
[52] U.S. Cl. ................ 307/296.5; 307/272.3; 307/350; 307/363
[58] Field of Search ........... 307/296.4, 296.5, 272.3, 307/350, 363, 597, 601, 290, 359; 328/115

[56] References Cited

U.S. PATENT DOCUMENTS

| | | | |
|---|---|---|---|
| 4,210,829 | 7/1980 | Wong et al. | 307/272.3 |
| 4,902,907 | 2/1990 | Haga et al. | 307/296.5 X |
| 4,948,995 | 8/1990 | Takahashi | 307/350 X |
| 5,027,006 | 6/1991 | Queinnec et al. | 307/296.5 X |

FOREIGN PATENT DOCUMENTS

| | | | |
|---|---|---|---|
| 0006623 | 1/1983 | Japan | 307/272.3 |
| 0222318 | 10/1986 | Japan | 307/272.3 |
| 62-209920 | 9/1987 | Japan | |

OTHER PUBLICATIONS

Toute l'Electronique, No. 454, May 1980, Paris, pp. 91-94 "Triggers de Schmitt C-MOS".

Electronic Design, vol. 34, No. 9, Apr. 1986, N.J., pp. 77,78,80,82,84 (Bernhard).

Research Disclosure, May 1987, No. 277, New York, p. 317, "CMOS On-Chip VDD Lock-Pulse".

Primary Examiner—Janice A. Howell
Assistant Examiner—Toan Tran
Attorney, Agent, or Firm—Herbert L. Lerner; Laurence A. Greenberg

[57] ABSTRACT

An integrated circuit for generating a reset signal includes terminals for a first and a second supply potential. A serial RC network is connected between the terminals. The RC network has an ohmic component, a capacitive component and a first circuit node of the integrated circuit connected between the components. An initializing circuit is connected parallel to the RC network. The initializing circuit has an output forming a second circuit node of the integrated circuit carrying a potential with a maximum value specified by dimensioning the initializing circuit, when the first supply potential is applied. An inverter circuit is connected between the first circuit node and the terminal for the second supply potential in terms of supply voltage. The inverter circuit has an input connected to the second circuit node and an output forming a third circuit node of the integrated circuit. A transistor has a source-to-drain path connected between the second circuit node and the terminal for the second supply potential and has a gate connected to the third circuit node. An additional inverter has an input at the third circuit node and an output forming a fourth circuit node of the integrated circuit at which a reset signal is present during operation.

13 Claims, 3 Drawing Sheets

INTEGRATED CIRCUIT FOR GENERATING A RESET SIGNAL

The invention relates to an integrated circuit for generating a reset signal.

When the supply voltage of complex circuits, particularly complex integrated circuits, is switched on, there is the danger that various circuit elements will assume an undefined state. However, undefined states generally cause malfunctions, to the point of damaging the circuits or electrical components that are connected to the circuits.

In order to avoid such malfunctions, a "power-on reset circuit" is therefore frequently provided, which generates a signal pulse that is usually individual (the so-called reset signal) when the supply voltage is applied, and which is intended to purposefully put critical circuits or circuit elements into a defined output state with respect to switching on the supply voltage, so as to avoid the above-discussed disadvantages.

It is accordingly an object of the invention to provide an integrated circuit for generating a reset signal when the supply voltage is applied, which overcomes the hereinaforementioned disadvantages of the heretofore-known devices of this general type, and which reliably meets the following specifications:

- the electrically active part of the reset signal should have a minimum duration, which is reliably adhered to for both a fast and a slow rise time of a supply voltage;

the minimum duration should also be adhered to even if the full value of the supply voltage drops below or exceeds the supply voltage threshold values specified by the manufacturer of the complex circuit;

in the case of a fluctuation in the supply voltage during operation, in other words after the application of the supply voltage and the reset process that has already taken place in response, reactivation of the reset signal should be reliably prevented; and the circuit should have as few circuit elements as possible and should occupy as little space as possible.

With the foregoing and other objects in view there is provided, in accordance with the invention, an integrated circuit for generating a reset signal, comprising terminals for a first and a second supply potential; a serial RC network connected between the terminals, the RC network having an ohmic component, a capacitive component and a first circuit node of the integrated circuit connected between the components; an initializing circuit being connected parallel to the RC network, the initializing circuit having an output forming a second circuit node of the complete integrated circuit carrying a potential with a maximum value specified by dimensioning the initializing circuit, when the first supply potential is applied; an inverter circuit connected between the first circuit node and the terminal for the second supply potential in terms of supply voltage, the inverter circuit having an input connected to the second circuit node and an output forming a third circuit node of the integrated circuit; a transistor of a first conduction type having a source-to-drain path or segment connected between the second circuit node and the terminal for the second supply potential and having a gate connected to the third circuit node; and an additional inverter having an input at the third circuit node and an output forming a fourth circuit node of the integrated circuit at which a reset signal is present during operation.

In accordance with another feature of the invention, there is provided a delay circuit connected downstream of the fourth circuit node, the delay circuit having an output receiving a second edge of the reset signal, following a first edge, in delayed fashion, during operation.

In accordance with a further feature of the invention, the initializing circuit includes at least one ohmic resistor connected between the terminal for the first supply voltage and the second circuit node.

In accordance with an added feature of the invention, the initializing circuit includes a second transistor of a second conduction type opposite the first conduction type, the second transistor is connected between the at least one ohmic resistor and the second circuit node, and the second transistor has a gate connected to the third circuit node.

In accordance with an additional feature of the invention, the initializing circuit includes two transistors of a second conduction type opposite the first conduction type, the two transistors having source-to-drain paths or segments connected in series with one another between the terminal for the first supply potential and the second circuit node and optionally in series with the ohmic resistor, one of the two transistors having a gate connected to the terminal for the second supply potential, and the other of the two transistors having a gate connected to the third circuit node.

In accordance with yet another feature of the invention, the initializing circuit includes one or at least two series-connected diodes connected between the second circuit node and the terminal for the second supply potential.

In accordance with yet a further feature of the invention, the diode or diodes are MOS transistors, and each respective MOS transistor has an interconnected gate and drain.

In accordance with yet an added feature of the invention, the inverter circuit includes at least one CMOS inverter having one p-channel transistor and one n-channel transistor.

In accordance with a concomitant feature of the invention, the p-channel transistor has a substrate connected to the first circuit node or through a high-impedance resistor to the terminal for the first supply potential.

Other features which are considered as characteristic for the invention are set forth in the appended claims.

Although the invention is illustrated and described herein as embodied in an integrated circuit for generating a reset signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
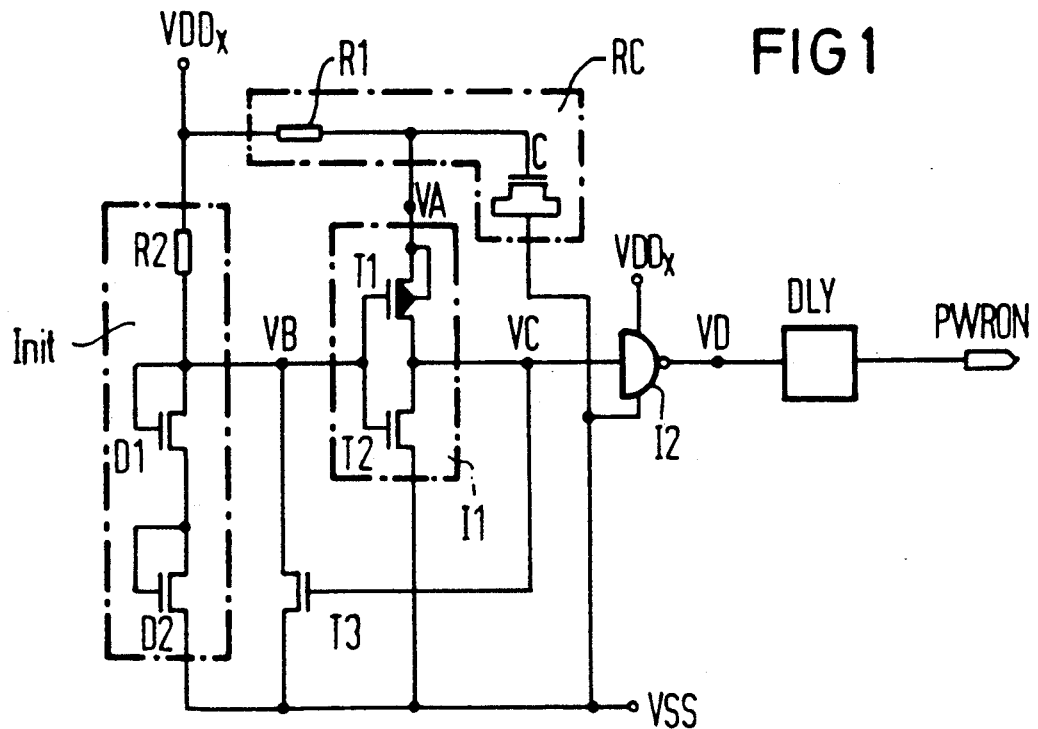
FIGS. 1 and 2 are schematic and block circuit diagrams of advantageous embodiments of the invention.

Referring now to the figures of the drawing in detail and first, particularly, to FIG. 1 thereof, there is seen an integrated circuit according to the invention with terminals for a first supply potential $VDD_x$ and a second supply potential VSS. The first supply potential $VDD_x$ typically has a value during operation, in other words after application of the supply voltage $VDD_x - VSS$, of $VDD = 5 \, V \pm 10\%$. Typically, the second supply potential is called ground, that is 0 V. Other values for the supply potentials $VDD_x$, VSS are naturally conceivable with suitable adaptation of the dimensioning and optionally of the polarization (for instance, the use of n-channel transistors instead of p-channel transistors, and vice versa), which is within the competence of one skilled in the art.

A serial resistor-capacitance network RC is disposed between the terminals for the supply potentials $VDD_x$, VSS and is shown as a serial circuit of an ohmic resistor R1 and an MOS transistor acting as a capacitance C (that is, its drain and source are short-circuited together). The capacitance C can naturally be constructed instead as a conventional capacitor. A connecting point between the ohmic resistor R1 and the capacitance C forms a first circuit node VA.

An initializing circuit Init is connected electrically parallel to the resistor-capacitance network RC and has an output at a second circuit node VB of the total circuit. The initializing circuit Init includes an ohmic resistor R2, which is disposed between the terminal for the first supply potential $VDD_x$ and the second circuit node VB. The initializing circuit Init also includes two n-channel transistors connected as diodes D1, D2, which are disposed in series with one another between the second circuit node VB and the terminal for the second supply potential VSS. The diode effect is attained due to the fact that the gate of each transistor is connected to the respectively associated drain. Viewed as a whole, the initializing circuit Init of FIG. 1 thus has a series circuit including the ohmic resistor R2 and the two diodes D1, D2. According to the invention, this makes it possible for the second circuit node VB to have a maximum potential value during operation, that never exceeds the sum of the second supply potential VSS + the saturation voltage of the first diode D1 + the saturation voltage of the second diode D2. Assuming values of 0 V for the first supply potential VSS, 1 V for the saturation voltage of the first diode D1, and 1.4 V for the saturation voltage of the second diode D2, the result is a maximum value of 2.4 V at the second circuit node.

An inverter circuit I1, which is shown as a CMOS inverter with two MOS transistors T1, T2 of opposite conduction types, is disposed between the first circuit node VA and the terminal for the second supply voltage VSS. An input of the inverter circuit I1 is connected to the second circuit node VB. An output of the inverter circuit I1 is formed by a third circuit node VC of the complete circuit.

An n-channel MOS transistor T3 has a channel segment between the second circuit node VB and the terminal for the second supply potential VSS. The gate of the transistor T3 is connected to the third circuit node VC.

The third circuit node VC is also an input of an additional inverter I2, which is connected in terms of supply voltage to the terminals for the two supply potentials $VDD_x$, VSS. The inverter I2 has an output which forms a fourth circuit node VD of the complete circuit. During operation, the reset signal of the complete circuit is produced at the fourth circuit node VD.

According to a further development of the basic concept of the invention, a delay circuit DLY is disposed on the output side of the fourth circuit node VD. During operation, this delay circuit sends a second edge of the reset signal, following a first edge, to an output PWRON in a delayed fashion. The duration of the reset signal between the two signal edges can thus be increased.

The functioning of the circuit according to the invention during operation, will be described below in conjunction with a timing diagram seen in FIG. 3. It is assumed that when the supply potentials $VDD_x$, VSS are switched on, the first supply potential $VDD_x$, at a time t1, still has a value of 0 V (which is equal to the second supply potential VSS) and then rises up to a rated value of $VDD_x = VDD$ (for example at 5 V) at a time t5. The second supply potential VSS has a value of 0 V. Upon the application of the supply potential, the potential of the first circuit node VA also rises up to the rated value VDD. However, due to the RC effect of the RC network RC (charging of the capacitive component C), this rise takes place markedly slower than that of the first supply potential $VDD_x$ (with the course of time being dependent on the dimensioning of the ohmic component R1 and the capacitive component C).

A potential rise also takes place at the second circuit node VB, but this proceeds markedly faster than at the first circuit node VA. The potential rise is limited by the two diodes D1, D2 to the aforementioned maximum value, which is above the value of the second potential VSS by the two diode saturation voltages $UD_1$, $UD_2$ (see the numerical example given earlier above, which is indicated as "$U_{D1+D2}$" in FIG. 3). The maximum value is attained at a time t2 and maintains its value then (until a time t4, which will be described below).

Due to the variously fast potential rises at the two circuit nodes VA, VB (mentioned above), the potential at the first circuit node VA at the time t2 is lower than the potential at the second circuit node VB. From the time t2 on, because of the constancy of the potential at the second circuit node VB that ensues at that time, the potential difference between the two circuit nodes VA, VB decreases down to zero (at a time not shown in FIG. 3), and subsequently the potential at the first circuit node VA becomes greater than that at the second circuit node VB.

Figure 3:
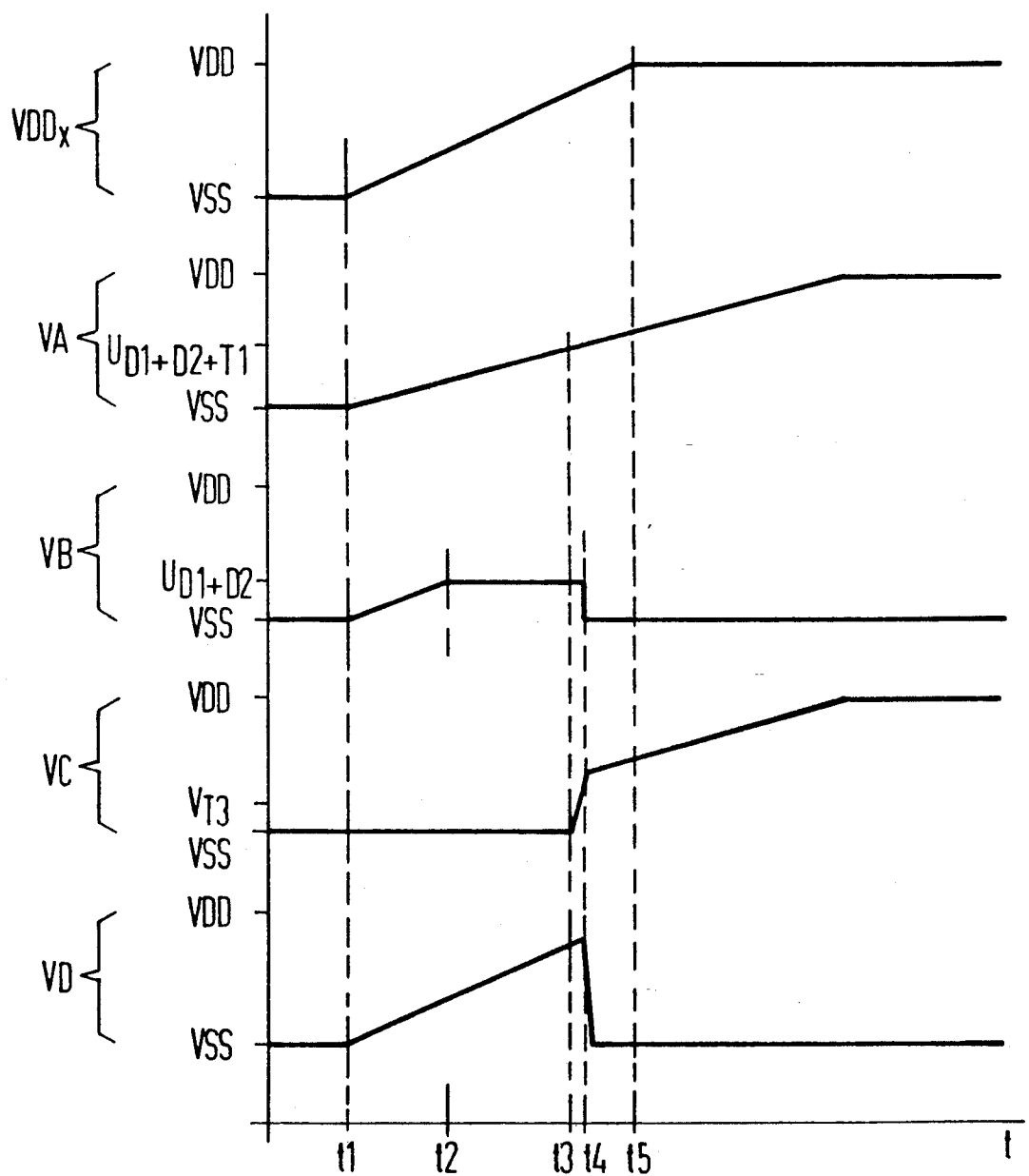
FIG. 3 is a timing diagram for the version of FIG. 1.

At a time t3, at which the second circuit node VB still has its maximum value $U_{D1+D2}$, the potential at the first circuit node VA has a value of $U_{D1+D2}$, plus the value of an operating voltage $V_{T1}$ of the p-channel transistor T1 of the CMOS inverter of the inverter circuit I1 (represented in FIGS. 3 as the value $U_{D1+D2+T1}$). Up to this time t3, the p-channel transistor T1 is blocked, while the n-channel transistor T2 of the CMOS inverter of the inverter circuit I1 is conductive (the potential at the second circuit node VB is greater than an operating voltage $V_{T2}$ of the n-channel transistor T2). Consequently, until the time t3, the third circuit node VC has the value of the second supply potential VSS (=0 V). Correspondingly, the potential at the fourth circuit node VD (which is the output of the inverter I2), in the period of time between the times t1 and t2, has the current value of the first supply potential $VDD_x$ at that time.

From the time t3, the potential at the first circuit node VA becomes greater than the aforementioned value $U_{D1+D2+T1}$, while the second circuit node VB maintains its potential at the level of $U_{D1+D2}$. Accordingly, the p-channel transistor T1 of the inverter circuit I1 becomes increasingly conductive. The potential at the third circuit node VC thus rises until the current value of the potential at the first circuit node VD. The fourth circuit node VD (which is the output of the inverter I2) thus assumes the value of the second supply potential VSS (=0 V).

With the rise of the potential at the third circuit node VC beyond the value of an operating voltage $V_{T3}$ of the n-channel transistor T3, this transistor becomes conducting (at a time t4) and thus pulls the potential at the second circuit node VB to the value of the second supply potential VSS (=0 V). Accordingly, the transistor T2 of the inverter circuit I1 then blocks, while the transistor T1 becomes even more strongly conducting.

The reset signal at the fourth circuit node VD accordingly has the following course over time, after the application of the first supply potential $VDD_x$: from the time t1 on, a rise takes place in the form of a first signal edge, which follows the course over time of the value of the first supply potential $VDD_x$, until a time at which the potential at the input of the inverter I2, or in other words at the third circuit node VC, matches the potential at which the inverter I2 switches over. At this time (which is not shown for the sake of simplicity), the inverter I2 switches over. In other words, a second, trailing signal edge ensues until the value of the second supply potential VSS. Thus the duration of the reset signal is defined by the duration of the rise of the first signal edge, plus the duration of the second signal edge (which is defined by the switching behavior of the inverter I2).

In order to increase the duration of the reset signal, it is advantageous for the delay circuit DLY, which delays the second edge of the reset signal, to be additionally connected to the output side of the inverter I2. The structure of the delay circuit DLY can be provided by means familiar to one skilled in the art.

The invention thus enables a reliable generation of a reset signal, which is not negatively affected by the steepness of the rise of the first supply potential $VDD_x$ (which may be variable, depending on the potential source). This is attained by providing that the first circuit node VA always has a slower potential rise than the second circuit node VB, so that the third circuit node VC, as the output of the inverter circuit I1, is kept constantly at the value of the second supply potential VSS until the time t3, because until the time t3, the inverter circuit I1 can never switch into its state that is complementary to the output state.

Once the react signal has first occurred, the circuit according to the invention also prevents the activation of the reset signal for an additional time if there are intrusions by the first supply potential $VDD_x$ down to a value of $VDD_x$ equal to the operating voltage $V_{T3}$ of the transistor T3. Any excess voltage pulses that occur in the first supply potential $VDD_x$ also leave the reset signal unaffected.

After the reset signal appears, a quadrature-axis current component, which can be kept suitably low by an appropriate dimensioning of the resistor R2, flows between the terminals for the two supply potentials $VDD_x$, VSS, through the resistor R2 of the initializing circuit Init and the transistor T3 (which is conducting in that case).

Figure 2:
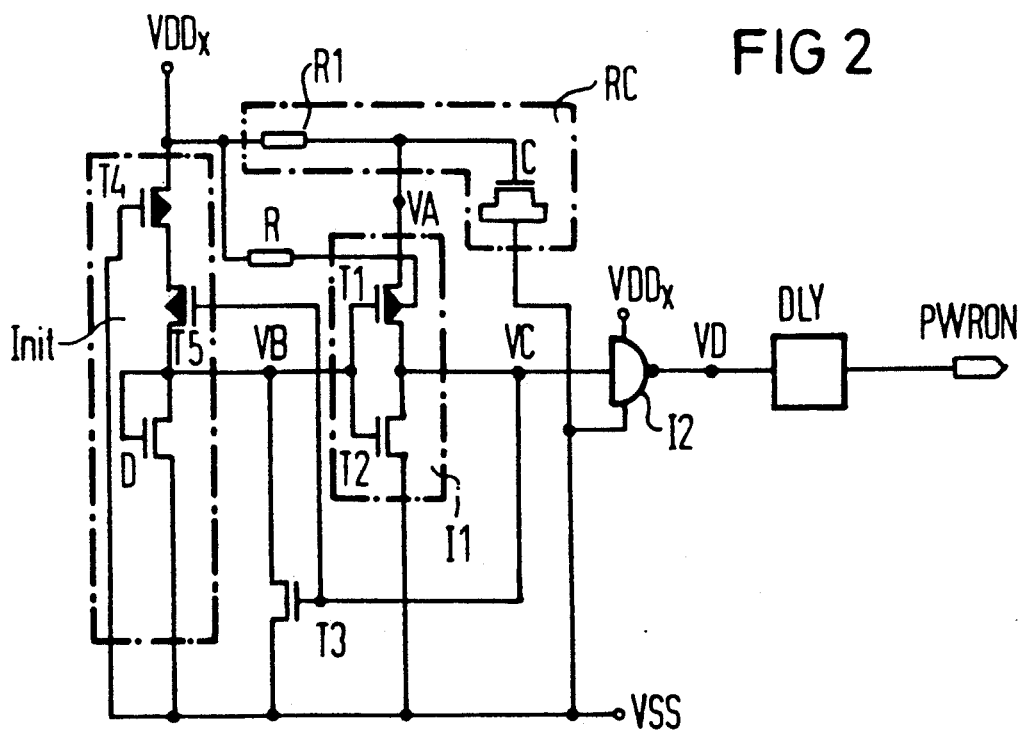

However, this quadrature-axis current component can be eliminated entirely by constructing the initializing circuit Init in accordance with FIG. 2. In this case, the resistor R2 is replaced by a series circuit of two p-channel transistors T4, T5. The gate of one transistor T4 is connected to the terminal for the second supply potential VSS, so that when the first supply potential $VDD_x$ is applied it becomes conducting. The transistor T4 then acts to limit the current. The gate of the other transistor T5, which may be referred to as a second transistor if the transistor T3 is a first transistor, is connected to the third circuit node VC. It thus becomes electrically conducting as well until shortly after the time t3, so that the second circuit node VB can assume the potential course already described above. However, due to the rise of the potential at the third circuit node VC from the time t3 on (as also already described), it blocks starting at a time at which the third circuit node VC has a potential that is below the current value of the first supply potential $VDD_x$ by no more than the value of the operating voltage of the transistor T5. In the embodiment of FIG. 2, the initializing circuit Init includes only a single diode D. This is also possible if its saturation voltage is dimensioned in accordance with the maximum value desired at the second circuit node VB.

Figure 4:
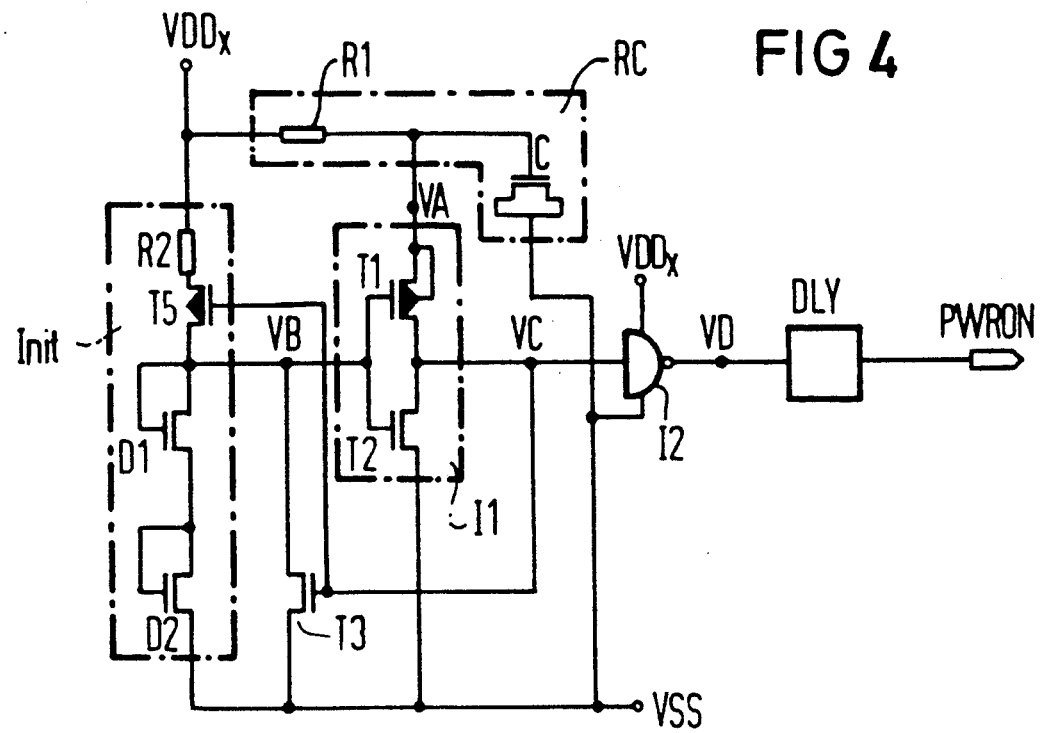
FIGS. 4 and 5 are circuit diagrams showing other embodiments pf the invention.
Figure 5:
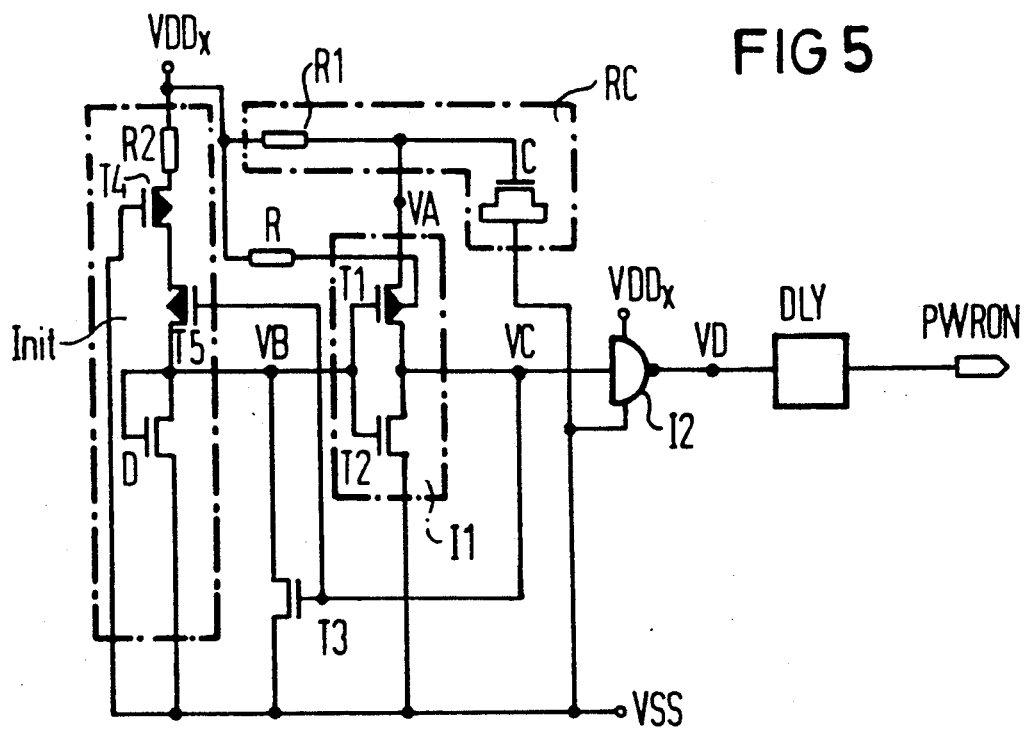

In the embodiment of FIG. 4, the transistor T5 is connected in series with the resistor R2 in the initializing circuit Init. In the FIG. 5 embodiment, both transistors T4 and T5 are connected in series with the resistor R2.

The two transistors T4, T5 may also be connected in series with the resistor R2. If the resistor R2 is used, the transistor T4 may also be omitted, since the resistor R2 acts in a current limiting fashion. However, in that case fluctuations in potential arising during operation of the first supply potential $VDD_x$ are then coupled through the source-to-gate capacitance of the transistor T5 directly to the third circuit node VC so that, if the potential fluctuations are major, the reset signal will undesirably recur.

It is also advantageous to connect the substrate of the transistor T1 of the inverter circuit I1 either to the first circuit node VA (see FIG. 1) or with high impedance (see FIG. 2) through a resistor R to the terminal for the first supply potential $VDD_x$. During operation, this precludes the first supply potential $VDD_x$ from dropping briefly below the value of the potential at the first circuit node VA, if potential fluctuations occur (that is, it prevents the source/drain diodes of the transistor T1 from being capable of switching in the on direction).

The invention has been described above on the assumption that the first supply potential $VDD_x$ should be more positive than the second supply potential VSS. However, it is also possible from the above description for one skilled in the art to modify the circuit according to the invention (particularly with suitable adaptation of the conductivity types of the transistors and diodes being used) in such a way that the first supply potential $VDD_x$ may be more negative than the second supply potential VSS.

One skilled in the art is also not limited to the use of precisely two diodes D1, D2 in the initializing circuit Init or the use of precisely one CMOS inverter having the transistors T1, T2 of the inverter circuit I1.

We claim:

1. An integrated circuit for generating a reset signal, comprising:
   terminals for a first and a second supply potential;
   a serial RC network connected between said terminals, said RC network having an ohmic component, a capacitive component and a first circuit node of the integrated circuit connected between said components;

an initializing circuit being connected parallel to said RC network, said initializing circuit having an output forming a second circuit node of the integrated circuit for providing a potential having a maximum value in response to the first supply potential;

an inverter circuit connected between said first circuit node and said terminal for the second supply potential for providing supply voltage for said inverter circuit, said inverter circuit having an input connected to said second circuit node and an output forming a third circuit node of the integrated circuit;

a transistor having a source-to-drain path connected between said second circuit node and said terminal for the second supply potential and having a gate connected to said third circuit node; and an additional inverter having an input at said third circuit node and an output forming a fourth circuit node of the integrated circuit at which a reset signal is present during operation.

2. The integrated circuit according to claim 1, including a delay circuit connected downstream of said fourth circuit node.

3. The integrated circuit according to claim 1, wherein said initializing circuit includes at least one ohmic resistor connected between said terminal for the first supply voltage and said second circuit node.

4. The integrated circuit according to claim 3, wherein said transistor is a first transistor of a first conduction type, said initializing circuit includes a second transistor of a second conduction type opposite the first conduction type, said second transistor is connected between said at least one ohmic resistor and said second circuit node, and said second transistor has a gate connected to said third circuit node.

5. The integrated circuit according to claim 1, wherein said transistor has a first conduction type, and said initializing circuit includes two transistors of a second conduction type opposite the first conduction type, said two transistors having source-to-drain paths connected in series with one another between said terminal for the first supply potential and said second circuit node, one of said two transistors having a gate connected to said terminal for the second supply potential, and the other of said two transistors having a gate connected to said third circuit node.

6. The integrated circuit according to claim 3, wherein said transistor has a first conduction type, and said initializing circuit includes two transistors of a second conduction type opposite the first conduction type, said two transistors having source-to-drain paths connected in series with one another between said terminal for the first supply potential and said second circuit node and in series with the ohmic resistor, one of said two transistors having a gate connected to said terminal for the second supply potential, and the other of said two transistors having a gate connected to said third circuit node.

7. The integrated circuit according to claim 1, wherein said initializing circuit includes a diode connected between said second circuit node and said terminal for the second supply potential.

8. The integrated circuit according to claim 1, wherein said initializing circuit includes at least two series-connected diodes connected between said second circuit node and said terminal for the second supply potential.

9. The integrated circuit according to claim 7, wherein said diode is an MOS transistor having an interconnected gate and drain.

10. The integrated circuit according to claim 8, wherein said diodes are MOS transistors, and each respective MOS transistor has an interconnected gate and drain.

11. The integrated circuit according to claim 1, wherein said inverter circuit includes at least one CMOS inverter having one p-channel transistor and one n-channel transistor.

12. The integrated circuit according to claim 11, wherein said p-channel transistor has a substrate connected to said first circuit node.

13. The integrated circuit according to claim 11, wherein said p-channel transistor has a substrate connected through a high-impedance to said terminal for the first supply potential.

* * * * *